US010396771B2

(12) United States Patent
Li et al.

(10) Patent No.: US 10,396,771 B2
(45) Date of Patent: Aug. 27, 2019

(54) VOLTAGE SUPPLY CIRCUITS AND CONTROLLING METHODS THEREFOR

(71) Applicant: MediaTek Inc., Hsin-Chu (TW)

(72) Inventors: Chih-Chen Li, Taichung (TW);
Kuan-Yu Fang, Hsin-Chu (TW);
Kuan-Yu Chu, Taipei (TW); Yen-Hsun Hsu, Hsinchu County (TW)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/921,513

(22) Filed: Mar. 14, 2018

(65) Prior Publication Data

US 2018/0205371 A1    Jul. 19, 2018

Related U.S. Application Data

(63) Continuation-in-part of application No. 15/038,588, filed as application No. PCT/CN2015/070684 on Jan. 14, 2015.

(60) Provisional application No. 61/927,155, filed on Jan. 14, 2014.

(51) Int. Cl.
| | |
|---|---|
| G05F 1/46 | (2006.01) |
| G05F 1/10 | (2006.01) |
| H03F 3/28 | (2006.01) |
| G05F 1/00 | (2006.01) |
| G05F 1/635 | (2006.01) |
| H02M 3/156 | (2006.01) |
| H03K 17/00 | (2006.01) |
| G06F 1/30 | (2006.01) |

(52) U.S. Cl.
CPC ............. *H03K 17/005* (2013.01); *G06F 1/30* (2013.01)

(58) Field of Classification Search
CPC .............. H03K 17/005; H02M 3/1584; H02M 2001/0032; H02M 2001/0048; Y02B 70/1491; Y02B 70/16
USPC ...... 327/108–112, 379, 389, 391; 326/22–27, 326/81–87
See application file for complete search history.

(56) References Cited

U.S. PATENT DOCUMENTS

| | | |
|---|---|---|
| 8,242,759 B2 | 8/2012 | Carroll et al. |
| 8,432,713 B2 | 4/2013 | Popescu et al. |
| (Continued) | | |

FOREIGN PATENT DOCUMENTS

| | | |
|---|---|---|
| CN | 102447390 A | 5/2012 |
| CN | 102804576 A | 11/2012 |

OTHER PUBLICATIONS

Extended European Search Report for Application No. EP 15737234.3 dated Nov. 28, 2016.
(Continued)

*Primary Examiner* — Brandon S Cole
(74) *Attorney, Agent, or Firm* — Wolf, Greenfield & Sacks, P.C.

(57) ABSTRACT

A voltage supply circuit is provided. The voltage supply circuit is capable of generating a loading current at an output node. The voltage supply circuit includes a plurality of inductors and a plurality of driver circuits. The plurality of inductors are coupled to the output node. Each inductor has an inductance value. The plurality of driver circuits are coupled to the plurality of inductors, respectively. The inductance values of at least two inductors among the plurality of inductors are greater than the inductance value of another inductor.

20 Claims, 8 Drawing Sheets

(56) References Cited

U.S. PATENT DOCUMENTS

| | | | |
|---|---|---|---|
| 2004/0196019 A1* | 10/2004 | Schneider | H02M 3/1584 323/285 |
| 2005/0093525 A1* | 5/2005 | Walters | H02M 3/1584 323/272 |
| 2007/0024360 A1* | 2/2007 | Markowski | H03F 1/0205 330/123 |
| 2008/0129259 A1 | 6/2008 | Endo et al. | |
| 2008/0303495 A1 | 12/2008 | Wei et al. | |
| 2010/0026261 A1 | 2/2010 | Candage et al. | |
| 2011/0169471 A1 | 7/2011 | Nagasawa | |
| 2011/0169476 A1 | 7/2011 | Ikriannikov et al. | |
| 2012/0313614 A1 | 12/2012 | Ohshita et al. | |
| 2013/0027009 A1 | 1/2013 | Tang et al. | |
| 2013/0049712 A1 | 2/2013 | Ueno | |
| 2013/0214751 A1 | 8/2013 | Shiraishi et al. | |
| 2013/0293207 A1 | 11/2013 | Wei et al. | |
| 2014/0049240 A1 | 2/2014 | Chen et al. | |
| 2014/0082377 A1 | 3/2014 | Dinh et al. | |
| 2015/0097542 A1 | 4/2015 | Repton et al. | |
| 2016/0294376 A1 | 10/2016 | Kuan et al. | |

OTHER PUBLICATIONS

International Search Report dated Apr. 16, 2015, issued in application No. PCT/CN2015/070684.

Jia et al., Two-stage voltage regulator for laptop computer CPUs and the corresponding advanced control schemes to improve light-light performance. IEEE Applied Power Electronics Conference and Exposition. 2004;(2):1294-1300.

Written Opinion dated Apr. 16, 2015 in connection with International Application No. PCT/CN2015/070684.

International Preliminary Report on Patentability dated Jul. 28, 2016 in connection with International Application No. PCT/CN2015/070684.

U.S. Appl. No. 15/038,588, filed May 23, 2016, Kuan et al.

* cited by examiner

| Mode | IL | The number of inductors |
|---|---|---|
| M20 | IL < VTH1 | 1 (11A) |
| M21 | VTH1 < IL < VTH2 | 2 (11A-11B) |
| M22 | VTH2 < IL < VTH3 | 3 (11A-11C) |
| M23 | VTH3 < IL | 4 (11A-11D) |

VOLTAGE SUPPLY CIRCUITS AND CONTROLLING METHODS THEREFOR

CROSS REFERENCE TO RELATED APPLICATIONS

This application is a continuation-in-part of U.S. application Ser. No. 15/038,588, filed May 23, 2016, entitled "VOLTAGE SUPPLY CIRCUITS AND CONTROLLING METHODS THEREFOR", which is a National Stage Application of International Application PCT/CN2015/070684, filed Jan. 14, 2015, which claims the benefit of U.S. Provisional Application No. 61/927,155, filed Jan. 14, 2014, each of which is incorporated herein by reference in its entirety.

BACKGROUND

1. Technical Field

The present disclosure relates to a voltage supply circuit, and more particularly, to a voltage supply circuit with enhanced efficiency in low-loading states.

2. Discussion of the Related Art

In a multi-phase voltage supplier, there are several inductors coupled to an output node of the voltage supplier. The number of inductors is determined according to the loading of the voltage supplier. However, one factor of the power loss of the voltage supplier is the resistance values of the inductors. There are two different types of resistance values for one inductor: an AC resistance (ACR) and a DC resistance (DCR). Thus, in a multi-phase voltage supplier, how to set inductance values of inductors appropriately for enhanced efficiency is an important issue.

SUMMARY

Thus, it is desirable to provide a voltage supply circuit which enhanced efficiency by enabling different inductors in different loading states.

Some embodiments relate to a voltage supply circuit for generating a loading current at an output node. The voltage supply circuit may comprise a plurality of inductors coupled to the output node, and a plurality of driver circuits to drive the plurality of inductors, respectively. Each of the plurality of inductors may have an inductance value. Inductance values of first and second inductors of the plurality of inductors may be greater than an inductance value of a third inductor of the plurality of inductors.

In some embodiments, first and second driver circuits of the plurality of driver circuits may be enabled to drive the first and second inductors, respectively, when the loading current has a non-zero magnitude.

In some embodiments, a third driver circuit of the plurality of driver circuits may be enabled to drive the third inductor when the loading current is higher than a first threshold.

In some embodiments, a ratio of the inductance value of the first inductor to the inductance value of the third inductor may be greater than 2 and less than 8.

In some embodiments, the ratio may be greater than 3 and less than 5.

In some embodiments, the first inductor and the second inductor may have the same inductance values.

In some embodiments, a first driver circuit of the plurality of driver circuits may drive the first inductor, a second driver circuit of the plurality of driver circuits may drive the second inductor and a third driver circuit of the plurality of driver circuits may drive the third inductor. The first driver circuit may switch at a first frequency lower than a second frequency at which another driver circuit of the plurality of driver circuits is switched.

In some embodiments, the second frequency may be a multiple of the first frequency.

In some embodiments, the second driver circuit may switch at the first frequency, and the third driver circuit may switch at the second frequency.

In some embodiments, the first inductor may be driven with a signal of a first phase, and the second inductor may be driven with a signal of a second phase different from the first phase.

In some embodiments, the third inductor may be driven with the signal of the first phase and the signal of the second phase.

Some embodiments relate to a voltage supply circuit for generating a loading current at an output node. The voltage supply circuit may comprise a plurality of inductors coupled to the output node, and a plurality of driver circuits to drive the plurality of inductors, respectively. Each of the plurality of inductors may have an inductance value. An inductance value of a first inductor of the plurality of inductors may be greater than an inductance value of another inductor of the plurality of inductors. A first driver circuit of the plurality of driver circuits may be coupled to the first inductor and the first driver circuit may be switched at a first frequency lower than a second frequency at which another driver circuit of the plurality of driver circuits is switched.

In some embodiments, the first driver circuit may be enabled to drive the first inductor when the loading current has a non-zero magnitude.

In some embodiments, a second driver circuit of the plurality of driver circuits may be enabled to drive a second inductor of the plurality of inductors and the first driver circuit may be enabled to drive the first inductor when the loading current is higher than a first threshold.

In some embodiments, a third driver circuit of the plurality of driver circuits may be enabled to drive a third inductor of the plurality of inductors, the second driver circuit may be enabled to drive the second inductor and the first driver circuit may be enabled to drive the first inductor when the loading current is higher than a second threshold.

In some embodiments, the another inductor may be a second inductor of the plurality of inductors. A ratio of the inductance value of the first inductor to an inductance value of the second inductor may be greater than 2 and less than 8.

In some embodiments, the ratio may be greater than 3 and less than 5.

In some embodiments, a ratio of the second frequency to the first frequency may be greater than 2 and less than 8.

In some embodiments, the ratio may be greater than 3 and less than 5.

In some embodiments, the another inductor may be a second inductor of the plurality of inductors. A ratio of the inductance value of the first inductor to an inductance value of the second inductor may be the same as a ratio of the second frequency to the first frequency.

A detailed description is given in the following embodiments with reference to the accompanying drawings.

The foregoing summary is provided by way of illustration and is not intended to be limiting.

BRIEF DESCRIPTION OF DRAWINGS

The invention can be more fully understood by reading the subsequent detailed description and examples with references made to the accompanying drawings, wherein.

DETAILED DESCRIPTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
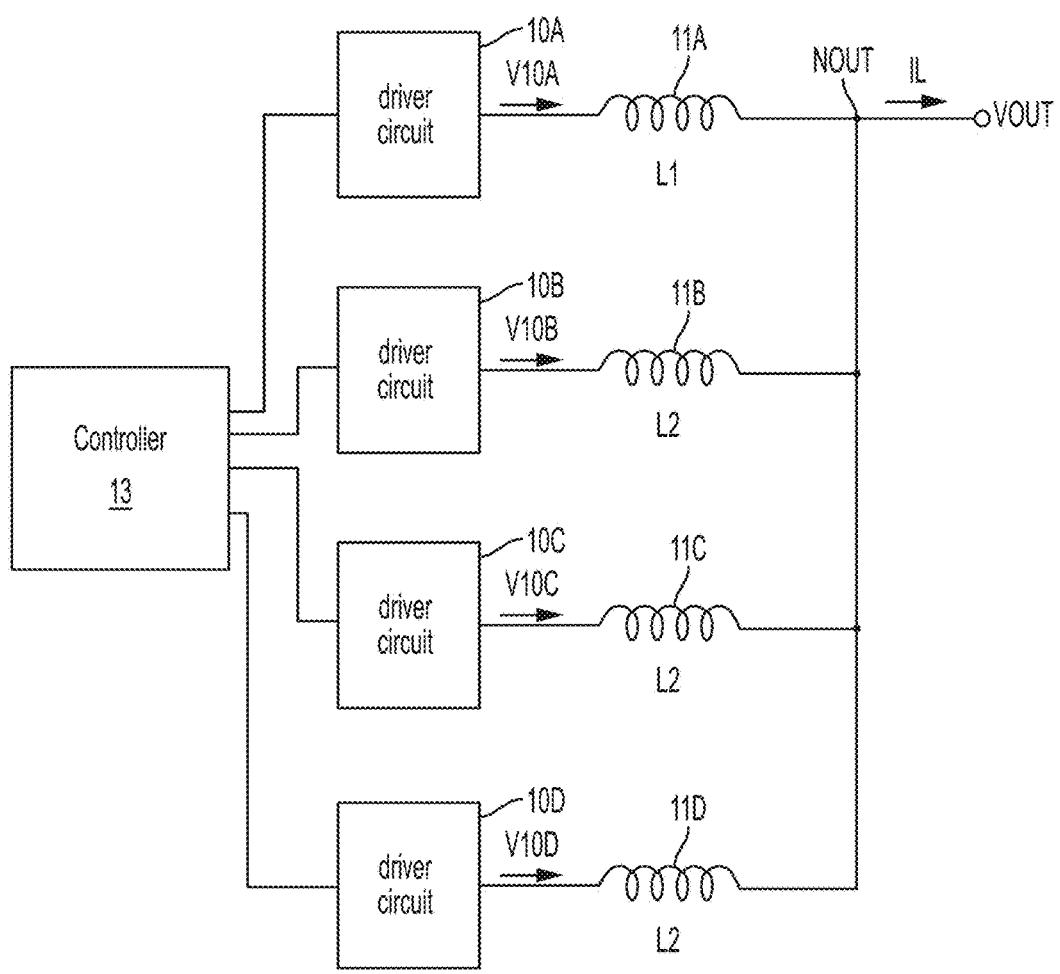
FIG. 1 shows an exemplary embodiment of a voltage supply circuit.

In an exemplary embodiment of voltage supply circuit as shown in FIG. 1, a voltage supply circuit 1 comprises a plurality of driver circuits 10 and a plurality of inductors 11. In the embodiment, there are four driver circuits 10A-10D and four inductors 11A-11D for an example. Referring to FIG. 1, the driver circuits 10A-10D are coupled to the inductors 11A-11D respectively, and all the inductors 11A-11D are coupled to an output node NOUT of the voltage supply circuit 1. According to the structure of the voltage supply circuit 1, there are four paths for providing an output voltage VOUT/loading current IL to the output node NOUT, and the four paths operate in four different phases respectively. The phase difference between the paths may depend upon the number of paths (e.g., 360 degrees divided by the number of paths, which for four paths is a 90 degree phase difference). Thus, the voltage supply circuit 1 is referred to as a multi-phase voltage suppler circuit.

Figures 2, 3:
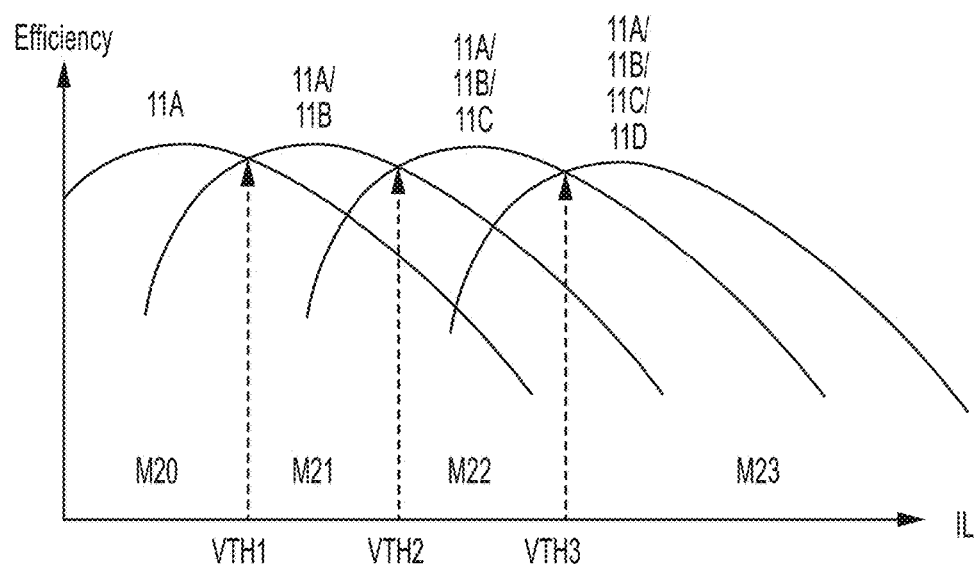
FIG. 2 shows relationship between the number of valid inductors and the different modes at which the voltage supply circuit in FIG. 1 operates by depending on a loading current.
FIG. 3 shows an exemplary embodiment of a curve of relationship between efficiency and a loading current of the voltage supply circuit of FIG. 1.

Each driver circuit generates a driving voltage to the corresponding inductor when the driver circuit is enabled. The situation where an inductor receives a driving voltage indicates that the inductor is valid. In the embodiment, the number of driver circuits being enabled at the same time is determined according to the loading current IL which is related to the loading state of the voltage supply circuit 1. The loading current IL is proportional to the loading state of the voltage supply circuit 1. In other words, the number of valid inductors is determined according to the loading current IL. When an inductor receives a corresponding driving voltage, an inductor current is generated. FIG. 2 shows the relationship between the number of valid inductors and the different modes at which the voltage supply circuit 1 operates in different loading current IL. Referring to FIG. 2, in order to make the voltage supply circuit 1 to operate in different modes, three thresholds VTH1-VTH3 are used for the loading current IL, wherein VTH1<VTH2<VTH3. When the loading current IL is smaller than the threshold VTH1 (first mode M20), the number of valid inductors is equal to one (such as the inductor 11A). That is, only one driver circuit among the driver circuit 10A-10D is enabled to generate a driving voltage V10A to the corresponding inductor 11A. When the loading current IL is smaller than the threshold VTH2 and larger than the threshold VTH1 (second mode M21), the number of valid inductors is equal to two (such as the inductors 11A and 11B). That is, two driver circuits among the driver circuit 10A-10D are enabled to generate driving voltages V10A and V10B to the corresponding inductors 11A and 11B respectively. When the loading current IL is smaller than the threshold VTH3 and larger than the threshold VTH2 (third mode M22), the number of valid inductor is equal to three (such as the inductors 11A-11C). That is, three driver circuits among the driver circuit 10A-10D are enabled to generate driving voltages V10A-V10C to the corresponding inductors 11A-11C respectively. When the loading current IL is larger than the threshold VTH3 (fourth mode M23), the number of valid inductors is equal to four (such as the inductors 11A-11D). That is, all of the driver circuits 10A-10D are enabled to generate driving voltages V10A-V10D to the corresponding inductors 11A-11D respectively.

In some embodiments, the driver circuits 10 may be inverters. The inverters may be connected to a supply voltage, and may be controlled to switch between the supply voltage and a low voltage (e.g., ground) at a switching frequency. The driver circuits 10 may be controlled by a controller 13, which may be a control circuit or a processor programmed with instructions for controlling the driver circuits. The controller 13 may control the driver circuits 10 to be enabled or disabled depending on the value of the loading current IL with respect to the thresholds.

Each of the inductors 11A-11D has two different resistance values: an AC resistance (ACR) value and a DC resistance (DCR) value. Both of the resistance values influence the efficiency of the voltage supply circuit 1. For each inductor, when the loading of the voltage supply circuit 1 is small (that is the loading current is small), the power loss induced by the ACR value of the inductor dominates the power loss of the voltage supply circuit 1. In this case, the inductor may have a large inductance value to decrease the ripple on the inductor current flowing through the inductor, thereby obtaining higher efficiency for the voltage supply circuit. In another case, when the loading is great (that is the loading current is larger), the power loss induced by the DCR value of the inductor dominates the power loss. At this time, the inductor may have a lower inductance value to decrease the average value of the inductor current flowing through the inductor, thereby obtaining higher efficiency for the voltage supply circuit. Thus, in the voltage supply circuit 1 of the embodiment, the inductors 11A-11D are set to specific inductance values for enhanced efficiency. For example, the inductor 11A has an inductance of L1 and the inductors 11B-11D have an inductance of L2, where L1>L2. In some embodiments, the ratio of the inductances L1/L2 may be greater than 1 and less than 10, such as greater than 2 and less than 8, including, for example, greater than 3 and less than 5.

According to the above description, when the loading current IL is small, only the inductor 11A is valid. For enhancing the efficiency, the inductance value of the inductor 11A is greater than the inductance values of the other inductors 11B-11D, and, thus the power loss induced by the ACR value of the inductor 11A is decreased. When the loading current IL is smaller than the threshold VTH1, the inductor 11A having a greater inductance value is valid for enhancing the efficiency. When the loading current IL is larger than the threshold VTH1, most of the inductors 11A-11D (excluding the inductor 11A) have lower inductance values, and, thus, the power loss induced by the DCR values of the inductors is decreased, thereby enhancing the efficiency. In this case, since at least two inductors are valid, the loading current IL obtained from the inductor current flowing through the at least two inductors is sufficient for the loading.

FIG. 3 shows an exemplary embodiment of a curve of a relationship between the efficiency and the loading current IL. As shown in FIG. 3, through the unbalanced inductance values of the inductors 11A-11D, the voltage supply circuit 1 has enhanced efficiency at the mode M20-M23.

Figure 4:
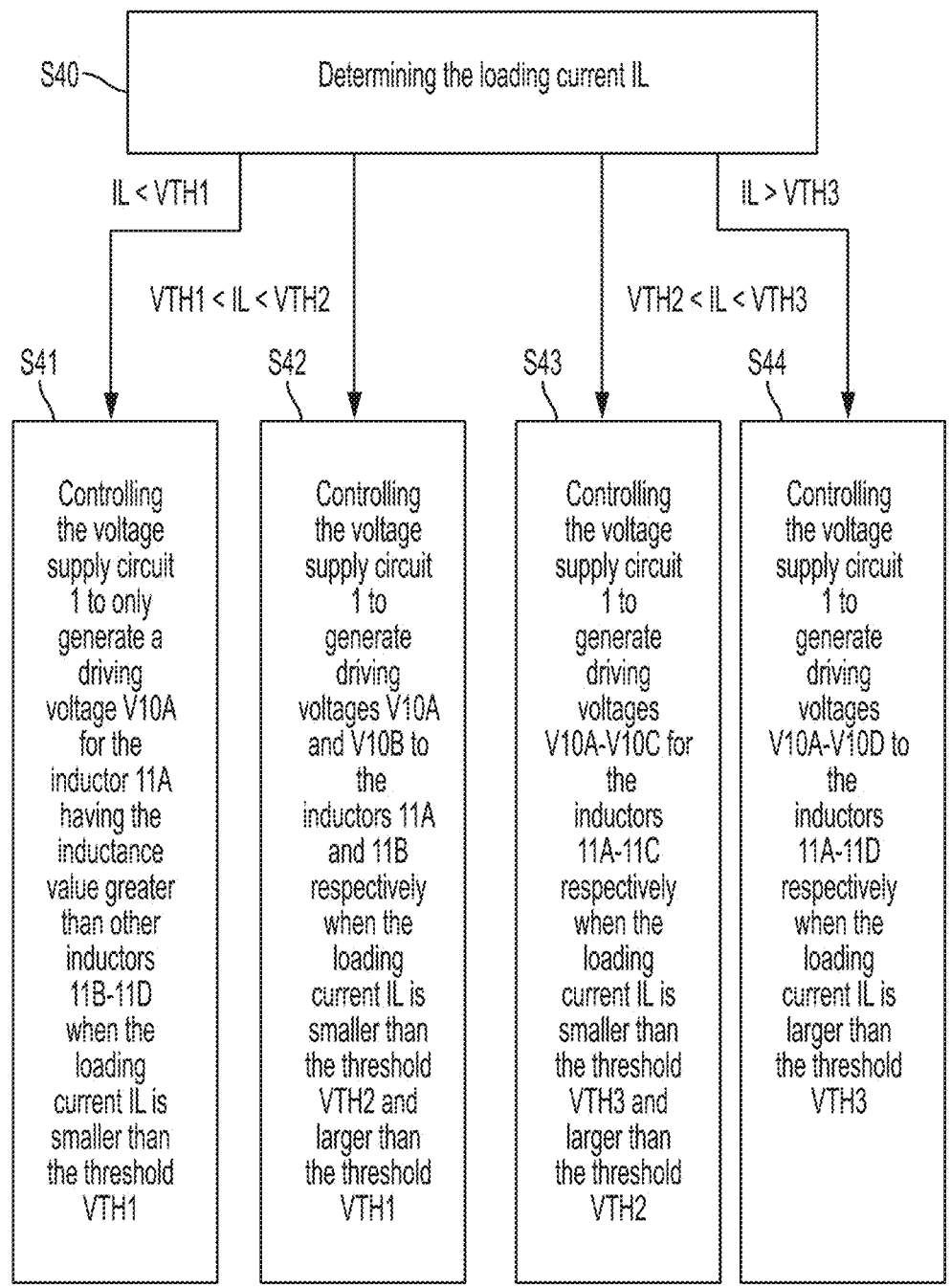
FIG. 4 shows an exemplary embodiment of a controlling method.

FIG. 4 shows an exemplary embodiment of a controlling method. In the following, the controlling method will be described by referring to FIGS. 1, 2, and 4. First, the loading state of the voltage supply circuit 1 is obtained by determining the loading current IL (step S40). When it is determined that the loading current IL is smaller than the threshold VTH1, the voltage supply circuit 1 enters the first mode M20, and the voltage supply circuit 1 is controlled to only enable the driver circuit 10A to generate a driving voltage V10A for the inductor 11A having the inductance value greater than other inductors 11B-11D (step S41). When it is determined that the loading current IL is smaller than the threshold VTH2 and larger than the threshold VTH1, the voltage supply circuit 1 enters the second mode M21, and the voltage supply circuit 1 is controlled to enable the driver circuits 10A and 10B to generate driving voltages V10A and V10B to the inductors 11A and 11B respectively (step S42).

When it is determined that the loading current IL is smaller than the threshold VTH3 and larger than the threshold VTH2, the voltage supply circuit 1 enters the third mode M22, and the voltage supply circuit 1 is controlled to enable the driver circuits 10A-10V to generate driving voltages V10A-V10C for the inductors 11A-11C respectively (step S43). When it is determined that the loading current IL is larger than the threshold VTH3, the voltage supply circuit 1 enters the fourth mode M23, and the voltage supply circuit 1 is controlled to enable all of the driver circuits 10A-10D to generate driving voltages V10A-V10D to the inductors 11A-11D respectively (step S44).

According to the embodiment of the controlling method, when the loading of the voltage supply circuit 1 is lower, the inductor which has the greater inductance value is valid, which can decrease power loss and thus enhance efficiency of the voltage supply circuit 1 due to decrement of the power loss induced by the ACR value. When the loading of the voltage supply circuit 1 current IL is greater, most of the valid inductors have lower inductance values, which can decrease power loss and thus enhance efficiency of the voltage supply circuit 1 due to decrement of the power loss induced by the DCR values of the valid inductors. Thus, the voltage supply circuit 1 has better efficiency at each of the modes M20-M23.

Above has been described an example of a voltage supply circuit 1 in which there is one larger inductor 11A and three smaller inductors 11B-11D. In some embodiments, a voltage supply circuit may include a plurality of larger inductors. The inventors have recognized and appreciated that including at least two relatively large inductors and at least one relatively small inductor in a voltage supply circuit can increase efficiency because the at least two relatively large inductors can operate in multi-phase in light-load conditions, and the at least one relatively small inductor can dominate in heavy-load conditions.

Figure 5:
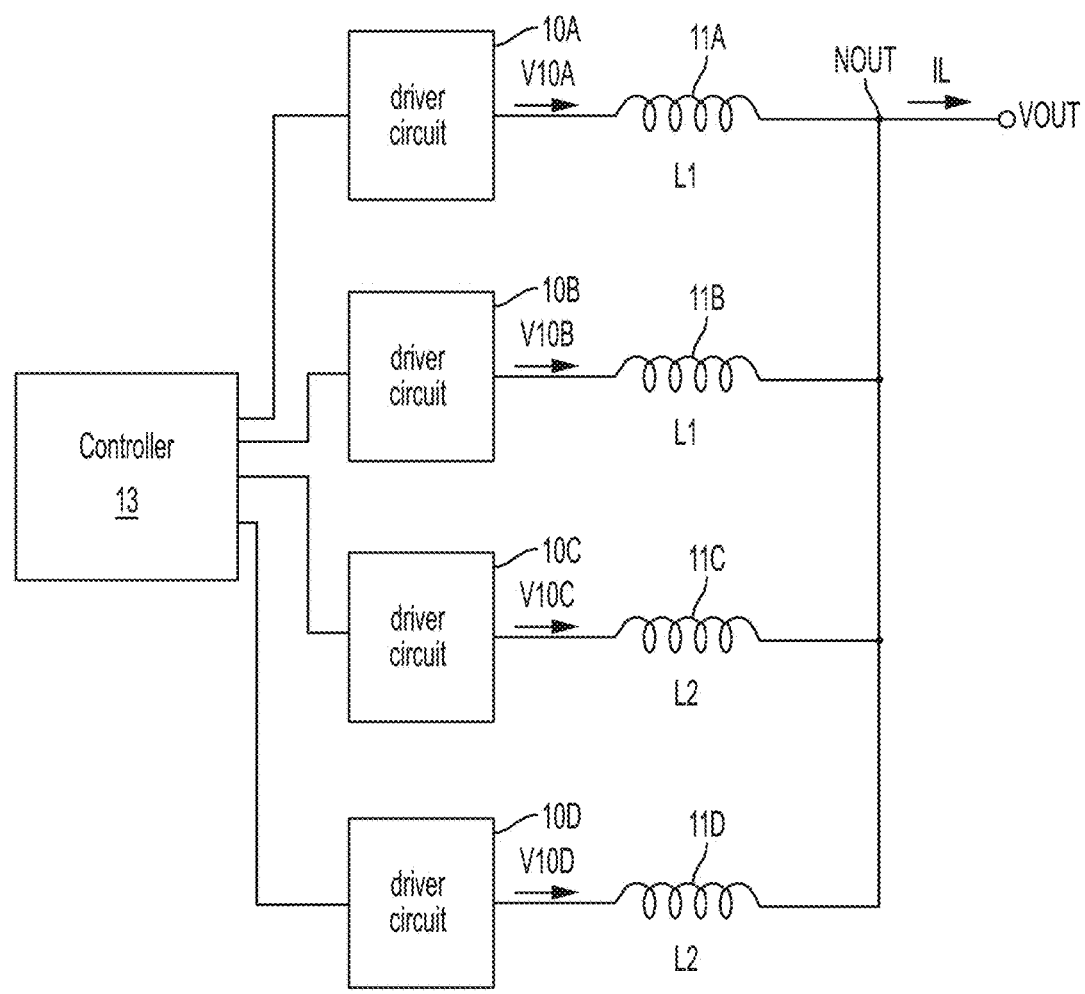
FIG. 5 shows an example of a voltage supply circuit with two inductors having an inductance L1.

FIG. 5 shows an example of a voltage supply circuit 51 in which inductors 11A and 11B have an inductance L1 and inductors 11C and 11D have an inductance L2, where L1>L2. Including a second relatively large inductor may increase efficiency in light-load conditions. When a loading current IL has a non-zero magnitude, driver circuits 10A and 10B may be enabled to drive the inductors 11A and 11B. When the loading current IL is below a first threshold ITH1, the driver circuits 10A and 10B may operate as a two-phase voltage supply circuit to generate an output voltage VOUT. When the loading current IL is above the first threshold ITH1 but below a second threshold ITH2, the driver circuit 11C may be enabled to drive the inductor 11C. As a result, three driver circuits among the driver circuits 10A-10D may be enabled and operate as a three-phase voltage supply circuit to generate the output voltage VOUT. When the loading current IL is above the second threshold ITH2, the driver circuit 11D may be enabled to drive the inductor 11D. As a result, the four driver circuits 10A-10D may be all enabled and operate as a four-phase voltage supply circuit to generate the output voltage VOUT.

Although inductors 11A and 11B may have the same inductance, in some embodiments they may have different inductances, each greater than the inductances of inductors 11C and 11D. Similarly, inductors 11C and 11D may have the same inductance L2 or different inductances. This technique may also be extended to include additional larger inductors. For example, a third relatively large inductor may be included by replacing inductor 11C with a larger inductor having a value L1.

Figure 6:
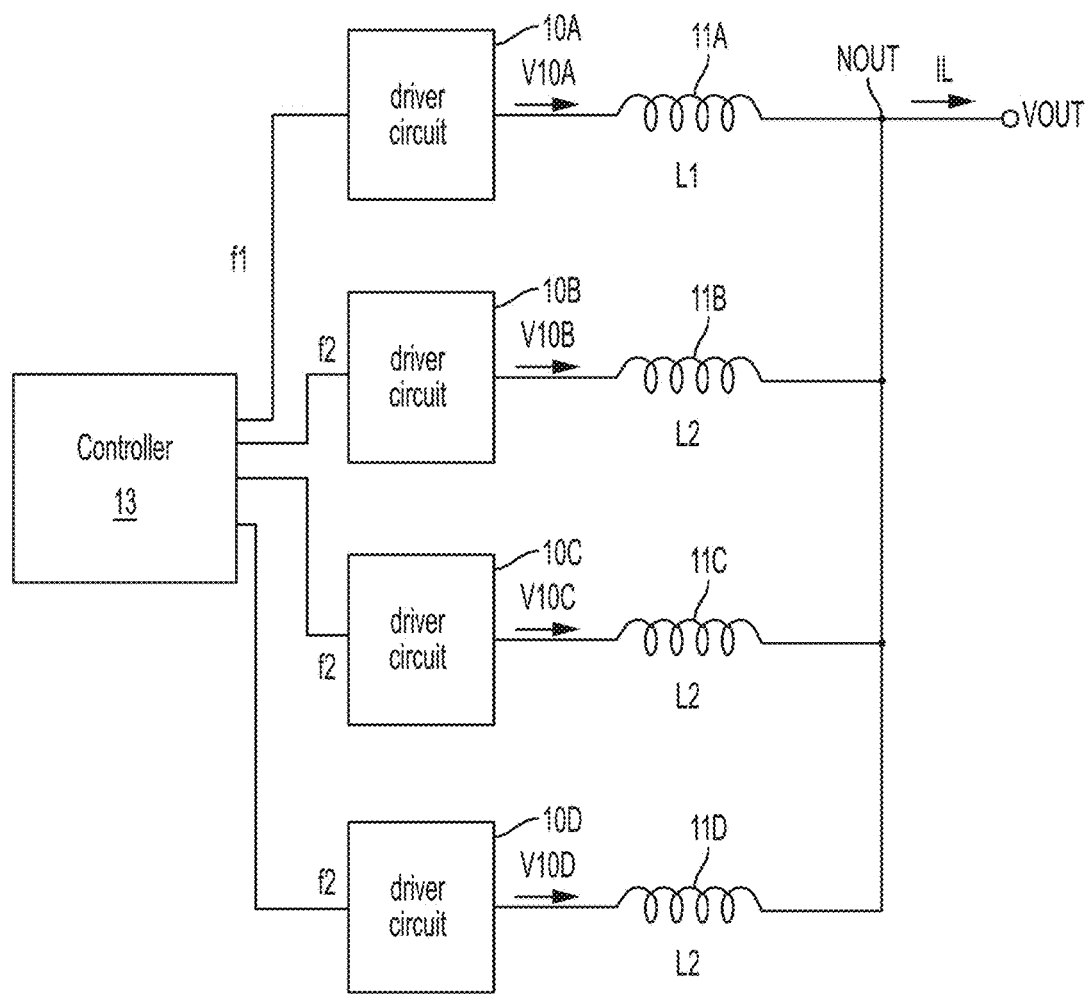
FIG. 6 shows an example of a voltage supply circuit with driver circuits switched at different frequencies.

In some embodiments, the driver circuits 10 may be switched at different frequencies. The inventors have recognized and appreciated that switching the smaller inductors 11 at a higher frequency may improve efficiency. FIG. 6 shows an example of a voltage supply circuit 61, according to some embodiments. Voltage supply circuit 61 may be similar to voltage supply circuit 1, discussed above. However, in voltage supply circuit 61 the driver circuits 10B, 10C and 10D are controlled by controller 13 to switch at a higher frequency f2 than the frequency f1 at which driver circuit 10A is switched. Using a higher switching frequency for driver circuits 10B, 10C and 10D decreases the ripple across inductors 11B, 11C and 11D, which improves the efficiency of the voltage supply circuit 61.

In some embodiments, the frequency f2 may be a multiple of the frequency f1. For example, the ratio of the frequencies f2/f1 may be 2, 3, 4, or any suitable integer number. In some embodiments, the frequency f1 may be between 100 kHz and 10 MHz, such as greater than 100 kHz and less than 5 MHz, including for example between 0.8 MHz and 1.2 MHz. However, this is by way of illustration, as in some embodiments the frequency f1 may be in a different range.

In some embodiments, the ratio of the frequencies f2/f1 is proportional to the ratio of the inductances L1/L2. For example, if the ratio L1/L2 is 4.0, the ratio of the frequencies f2/f1 may also be 4.0. However, the ratio of the frequencies need not be the same as the ratio of the inductances. In some embodiments, the ratio of the inductances L1/L2 may be greater than 1 and less than 10, such as greater than 2 and less than 8, including, for example, greater than 3 and less than 5. In some embodiments, the ratio of the frequencies f2/f1 may be greater than 1 and less than 10, such as greater than 2 and less than 8, including, for example, greater than 3 and less than 5. However, this is by way of illustration, as in some embodiments the ratio of inductances and/or frequencies may be in a different range.

Figure 7:
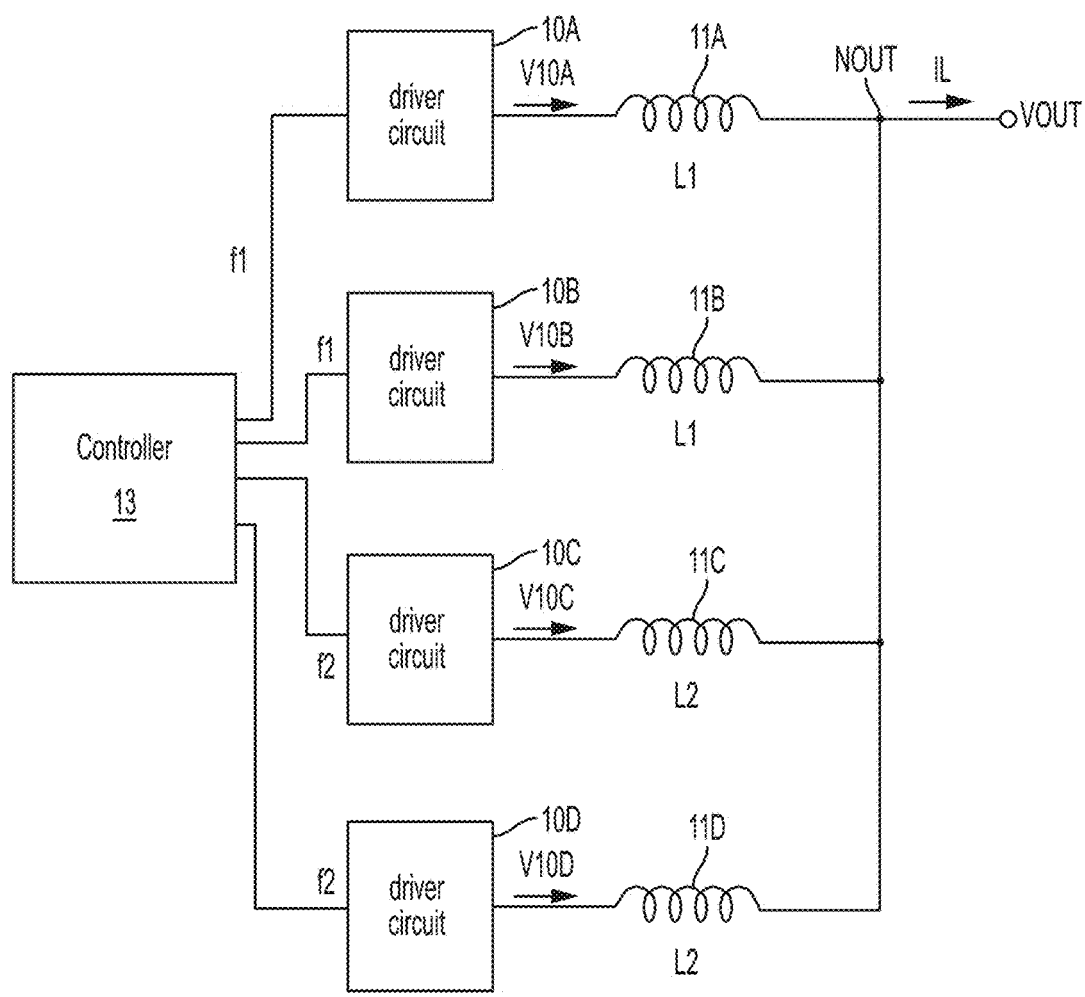
FIG. 7 shows an example of a voltage supply circuit with two inductors having an inductance L1 with driver circuits switched at different frequencies.

FIG. 7 shows an embodiment of a voltage supply circuit 71 that combines the characteristics of the embodiment of FIG. 5, in which there are at least two relatively large inductors and FIG. 6, in which the driver circuits 10 are switched at different switching frequencies. In this embodiment, driver circuits 10A and 10B may be switched at a lower frequency f1 than the frequency f2 at which driver circuits 10C and 10D are switched. Such an embodiment may improve efficiency for light loads and heavier loads.

Figure 8:
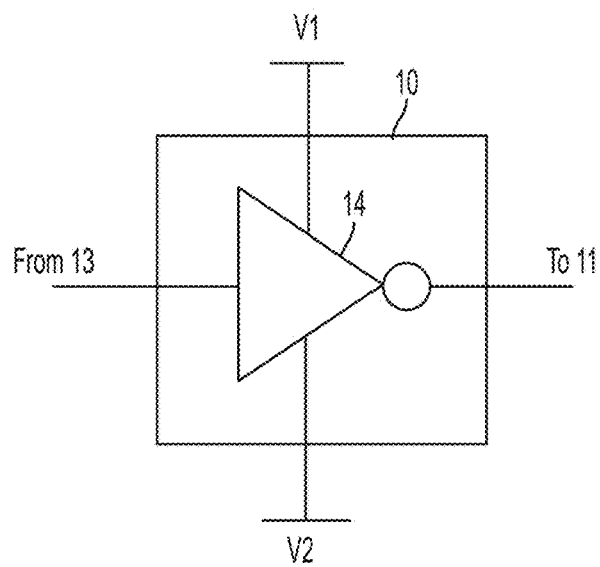
FIG. 8 shows an example of a driver circuit having an inverter.

FIG. 8 illustrates a driver circuit 10 that includes an inverter 14. The inverter 14 may receive a signal from the controller 13 that controls the inverter to switch such that its output switches between voltage V1 and voltage V2 to drive an inductor 11. However, it should be appreciated that the driver circuits 10 need not be implemented by inverters, as in some embodiments they may implemented by buffers or other suitable driver circuitry.

Figure 9:
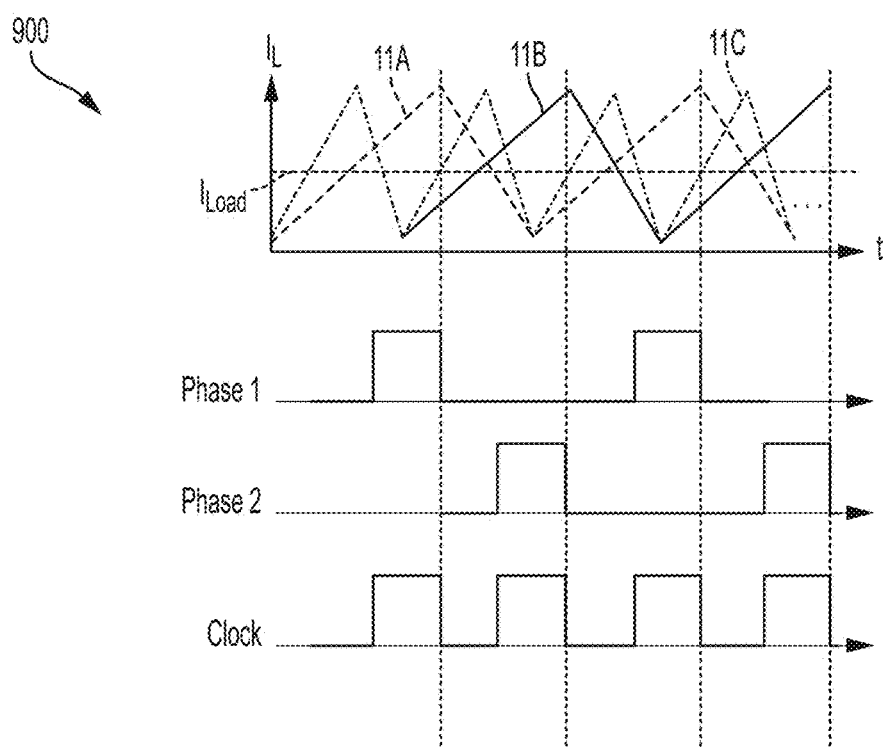
FIG. 9 shows an exemplary timing diagram of a voltage supply circuit when three driver circuits are enabled to drive three inductors, respectively, according to some embodiments.

FIG. 9 shows an exemplary timing diagram 900 of a voltage supply circuit when three driver circuits are enabled to drive three inductors, respectively, according to some embodiments. FIG. 9 illustrates an example of a timing diagram of currents in the voltage supply circuit 71 when the driver circuits 10A, 10B and 10C are enabled to drive the inductors 11A, 11B and 11C. The driver circuits 10A, 10B and 10C may be driven with signals of different phases generated from a system clock, which may be provided by, for example, a controller 13. The driver circuit 10A may be driven by a signal of phase 1. The driver circuit 10B may be driven by a signal of phase 2, which may be of a 180 degree phase difference from the signal of phase 1. The driver circuit 10C may be driven by the signal of phase 1 and the signal of phase 2 such that the loading current IL, which is a sum of the currents provided by the inductors 11A, 11B and 11C, is above a predetermined target $I_{LOAD}$. In the illustrated example, the driver circuit 10C switches at a frequency twice of the frequency at which the driver circuit 10A or 10B switches.

Figure 10:
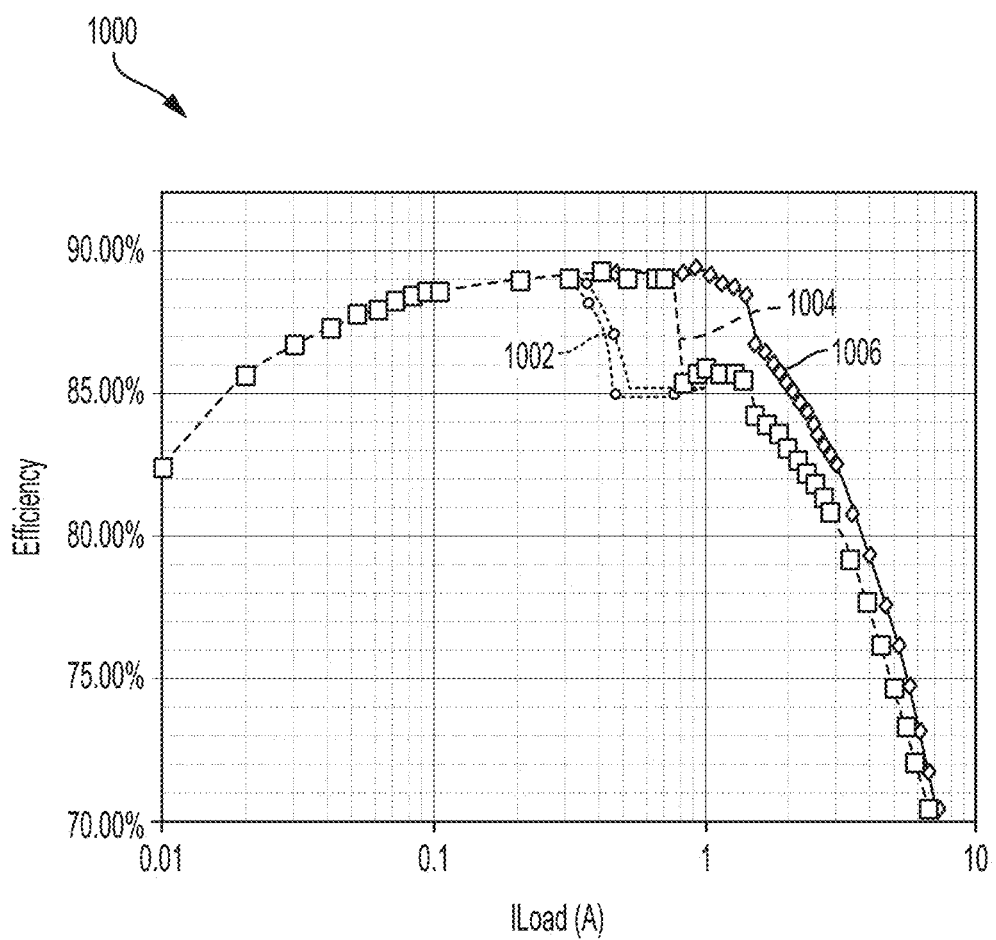
FIG. 10 shows exemplary efficiency curves depending on loading currents of voltage supply circuits, according to some embodiments.

FIG. 10 shows exemplary efficiency curves depending on loading currents of voltage supply circuits, according to some embodiments. Curve 1002 may show the measured efficiency of a voltage supply circuit with an inductor of 1 μH and an inductor of 0.24 μH, both of which may be switched at 3.6 MHz. Curve 1004 may show the measured efficiency of a voltage supply circuit with two inductors of 1 μH and an inductor of 0.24 μH, all of which may be switched at 3.6 MHz. Curve 1006 may show the measured efficiency of a voltage supply circuit with two inductors of 1 μH, both of which may be switched at 0.9 MHz and an inductor of 0.24 μH, which may be switched at 3.6 MHz. However, this is by way of illustration, as in some embodiments the values of inductances and frequencies may be different. It should be appreciated that the curve 1004 extends the range of the loading current with high efficiency (e.g., above 85%) compared with the curve 1002. The curve 1006 further extends the range of the loading current with high efficiency compared with the curve 1004.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A voltage supply circuit for generating a loading current at an output node, the voltage supply circuit comprising:
    a plurality of inductors coupled to the output node, each having an inductance value, wherein:
        inductance values of first and second inductors of the plurality of inductors are greater than an inductance value of a third inductor of the plurality of inductors,
        the first inductor is driven by a first signal, and
        the second inductor is driven by a phase-shifted version of the first signal; and
    a plurality of driver circuits to drive the plurality of inductors, respectively, wherein:
        at least one driver circuit is enabled to generate the loading current lower than a current threshold at which another of the plurality of driver circuits is enabled, and
        the third inductor is driven by the first signal and the phase-shifted version of the first signal when its respective driver circuit is enabled.

2. The voltage supply circuit of claim 1, wherein first and second driver circuits of the plurality of driver circuits are enabled to drive the first and second inductors, respectively, when the loading current has a non-zero magnitude.

3. The voltage supply circuit of claim 2, wherein a third driver circuit of the plurality of driver circuits is enabled to drive the third inductor when the loading current is higher than a first threshold.

4. The voltage supply circuit of claim 1, wherein a ratio of the inductance value of the first inductor to the inductance value of the third inductor is greater than 2 and less than 8.

5. The voltage supply circuit of claim 4, wherein the ratio is greater than 3 and less than 5.

6. The voltage supply circuit of claim 1, wherein the first inductor and the second inductor have the same inductance values.

7. The voltage supply circuit of claim 1, wherein a first driver circuit of the plurality of driver circuits drives the first inductor, a second driver circuit of the plurality of driver circuits drives the second inductor and a third driver circuit of the plurality of driver circuits drives the third inductor, and wherein the first driver circuit switches at a first frequency lower than a second frequency at which another driver circuit of the plurality of driver circuits is switched.

8. The voltage supply circuit of claim 7, wherein the second frequency is a multiple of the first frequency.

9. The voltage supply circuit of claim 8, wherein the second driver circuit switches at the first frequency, and the third driver circuit switches at the second frequency.

10. The voltage supply circuit of claim 3, wherein a fourth driver circuit of the plurality of driver circuits is enabled to drive a fourth inductor of the plurality of inductors when the loading current is higher than a second threshold.

11. The voltage supply circuit of claim 10, wherein the third and fourth driver circuits operate in different phases.

12. A voltage supply circuit for generating a loading current at an output node, the voltage supply circuit comprising:
- a plurality of inductors coupled to the output node, each having an inductance value, wherein an inductance value of a first inductor of the plurality of inductors is greater than an inductance value of a second inductor of the plurality of inductors; and
- a plurality of driver circuits to drive the plurality of inductors, respectively, wherein:
  - a first driver circuit of the plurality of driver circuits is coupled to the first inductor,
  - the first driver circuit is switched at a first frequency lower than a second frequency at which another driver circuit of the plurality of driver circuits is switched, and
  - a ratio of the inductance value of the first inductor to an inductance value of the second inductor is the same as a ratio of the second frequency to the first frequency.

13. The voltage supply circuit of claim 12, wherein the first driver circuit is enabled to drive the first inductor when the loading current has a non-zero magnitude.

14. The voltage supply circuit of claim 13, wherein a second driver circuit of the plurality of driver circuits is enabled to drive a second inductor of the plurality of inductors and the first driver circuit is enabled to drive the first inductor when the loading current is higher than a first threshold.

15. The voltage supply circuit of claim 14, wherein a third driver circuit of the plurality of driver circuits is enabled to drive a third inductor of the plurality of inductors, the second driver circuit is enabled to drive the second inductor and the first driver circuit is enabled to drive the first inductor when the loading current is higher than a second threshold.

16. The voltage supply circuit of claim 12, wherein the ratio of the inductance value of the first inductor to the inductance value of the second inductor is greater than 2 and less than 8.

17. The voltage supply circuit of claim 16, wherein the ratio is greater than 3 and less than 5.

18. The voltage supply circuit of claim 12, wherein the ratio of the second frequency to the first frequency is greater than 2 and less than 8.

19. The voltage supply circuit of claim 18, wherein the ratio is greater than 3 and less than 5.

20. The voltage supply circuit of claim 15, wherein the second and third driver circuits operate in different phases.

* * * * *